(12) United States Patent
Kuisma et al.

(10) Patent No.: US 10,322,927 B2
(45) Date of Patent: Jun. 18, 2019

(54) MICROELECTROMECHANICAL DEVICE AND METHOD FOR MANUFACTURING IT

(71) Applicant: MURATA MANUFACTURING CO., LTD., Nagaokakyo-shi, Kyoto (JP)

(72) Inventors: Heikki Kuisma, Helsinki (FI); Matti Mantysalo, Lempäälä (FI)

(73) Assignee: MURATA MANUFACTURING CO., LTD., Nagaokakyo-shi, Kyoto (JP)

( * ) Notice: Subject to any disclaimer, the term of this patent is extended or adjusted under 35 U.S.C. 154(b) by 0 days.

(21) Appl. No.: 15/954,128

(22) Filed: Apr. 16, 2018

(65) Prior Publication Data

US 2018/0230002 A1 Aug. 16, 2018

Related U.S. Application Data

(62) Division of application No. 15/372,660, filed on Dec. 8, 2016, now Pat. No. 9,969,607.

(30) Foreign Application Priority Data

Dec. 15, 2015 (FI) ..................................... 20155948

(51) Int. Cl.
*B81B 7/00* (2006.01)
*B81C 1/00* (2006.01)

(52) U.S. Cl.
CPC ........ *B81B 7/0006* (2013.01); *B81C 1/00095* (2013.01); *B81C 1/00373* (2013.01); *B81B 2207/07* (2013.01); *B81C 2201/0184* (2013.01)

(58) Field of Classification Search
CPC ........ B81C 1/00095; B81C 2201/0184; B81C 1/00373; B81B 7/0006; B81B 2207/07
See application file for complete search history.

(56) References Cited

U.S. PATENT DOCUMENTS

| 6,936,902 B2 | 8/2005 | Reichenbach |
| 2004/0121506 A1 | 6/2004 | Gogoi |

(Continued)

FOREIGN PATENT DOCUMENTS

| JP | 2006-269696 A | 10/2006 |
| JP | 2009-006453 A | 1/2009 |

(Continued)

OTHER PUBLICATIONS

European Search Report corresponding to Application No. EP16203433, dated Apr. 28, 2017. No copy provided, per MPEP 609. Copy submitted in parent U.S. Appl. No. 15/372,660.

*Primary Examiner* — Jasmine J Clark
(74) *Attorney, Agent, or Firm* — Squire Patton Boggs (US) LLP (57) ABSTRACT

A device and method utilizes interconnecting layers separated by an insulating layer. A layered structure comprises a first and a second layer of electrically conductive material, and a third layer of electrically insulating material between them. A via trench is fabricated that extends from the second layer through the third layer into the first layer, a surface on the first layer of electrically conductive material forming a bottom surface of the via trench. An ink-jetting set-up for a mixture of liquid carrier and nanoparticles of conductive material is formed, and a specific process period is determined. Capillary flow of nanoparticles to peripheral edges of an ink-jetted blob of said mixture is induced. The mixture is ink-jetted into a blob on the via trench; the layered structure is heated to evaporate the liquid carrier. The interconnection element is higher at a certain point than between opposing side walls.

10 Claims, 7 Drawing Sheets

(56) References Cited

U.S. PATENT DOCUMENTS

| | | |
|---|---|---|
| 2008/0116534 A1 | 5/2008 | Grosjean et al. |
| 2008/0220155 A1 | 9/2008 | Yoshizumi et al. |
| 2009/0184357 A1 | 7/2009 | Wu |
| 2011/0159250 A1 | 6/2011 | Rider et al. |
| 2015/0179579 A1* | 6/2015 | Jezewski ........... H01L 21/76846 257/753 |

FOREIGN PATENT DOCUMENTS

| | | |
|---|---|---|
| WO | 2008/069176 A1 | 6/2008 |
| WO | 2014/120001 A1 | 8/2014 |
| WO | 2015154173 A1 | 10/2015 |

* cited by examiner

Prior Art

Fig. 1

Prior Art

MICROELECTROMECHANICAL DEVICE AND METHOD FOR MANUFACTURING IT

CROSS REFERENCE TO RELATED APPLICATION

This application is a Divisional of application Ser. No. 15/372,660 filed on Dec. 8, 2016, now U.S. Pat. No. 9,969,607, which claims priority to Application No. 20155948 filed in Finland, on Dec. 15, 2015. The entire content of all of the above referenced applications are hereby incorporated by reference.

BACKGROUND

The present invention relates to a microelectromechanical device and to an improved method for manufacturing a microelectromechanical device.

DESCRIPTION OF THE RELATED ART

Microelectromechanical systems (MEMS) can be applied to quickly and accurately detect very small changes in physical properties. Many MEMS devices are manufactured from layered solid structures, like silicon-on-insulator (SOI) or cavity-silicon-on-insulator (cavity-SOI) wafers. A SOI-wafer typically comprises a handle wafer layer, a buried oxide (BOX) layer, and a device layer. The handle wafer layer is usually the thickest part, some hundreds of micron thick, while the device layer is typically tens of microns thick. The BOX layer is typically from fraction of a micron to a few microns thick. In a cavity-SOI wafer, the handle wafer usually contains cavities at some locations. The depth of the cavity may be from microns to tens of microns. The BOX layer may be deposited either on the handle wafer, or the device layer, and the two pieces of silicon may be bonded to each other so that the BOX layer is in between them and isolates the device layer electrically from the handle wafer Structures of the MEMS device (MEMS structures) are typically manufactured into the device layer of a SOI, or a cavity-SOI wafer by etching trenches into and/or through the device layer. When cavity-SOI wafers are used, some of the MEMS structures are typically designed to coincide with the cavities. In a SOI wafer, or if movable structures are needed on non-cavity area of a cavity-SOI wafer, sacrificial etching of the BOX layer can be used to mechanically release the desired MEMS structures from the BOX layer and thus also from the handle wafer.

Figure 1:
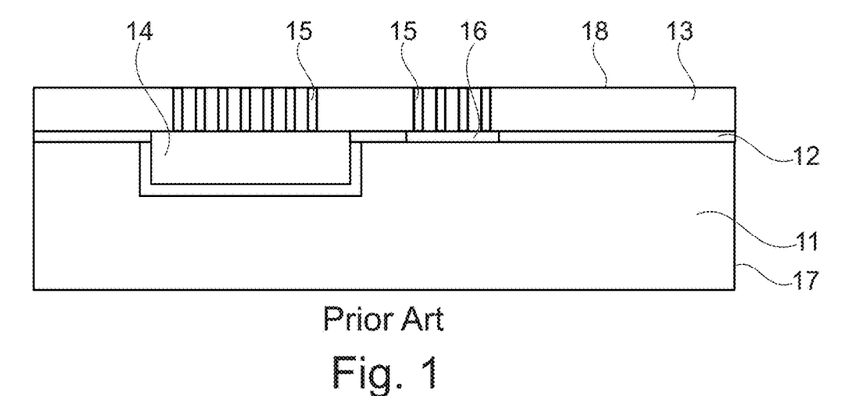
FIG. 1 illustrates a configuration of a conventional MEMS structure on a cavity-SOI wafer.

FIG. 1 illustrates a configuration of a conventional MEMS structure on a cavity-SOI wafer. In the exemplary MEMS device, a handle wafer 11 is covered with a buried oxide layer 12, and a device layer 13 is attached to the buried oxide layer. Cavities 14 have been manufactured in the handle wafer. A multitude of trenches 15 are etched through the device layer at various locations. Part of the buried oxide 16 has been removed from some of the areas where the trenches are located.

In many cases the whole functionality of the MEMS device is built into the device layer and the handle wafer acts only as a mechanical support and part of the encapsulation of the MEMS device. However, since the handle wafer is of silicon material, it will be electrically conductive at least to some degree, depending on the doping level of the handle wafer. This may have some effect on the device performance because of the capacitive coupling from the handle wafer to the device layer over the BOX layer or over the sacrificially etched areas. One of the aims of the cavities in cavity-SOI is to reduce this capacitive coupling at the areas of the cavities.

For stable and undisturbed operation of a MEMS device it is required that the handle wafer can be connected to an electrical potential that is least harmful to the device operation. If the handle wafer is electrically floating without connection to any external potential, or if it is connected to an unsuitable electrical potential, the device operation may be adversely affected by several mechanisms. These adverse effects include loading by stray capacitances, unwanted coupling of electrical signals within the MEMS device and unwanted coupling of external electrical signals to the MEMS device. One example of an unwanted electrical signal that may couple to the MEMS device is radio transmission from near-by radios like a WiFi, cellular phone or BlueTooth radio. Another example is electrical coupling from near-by digital signal lines e.g. in a stacked packaging configuration where the MEMS device is mounted on top of an electrical circuit. Often the best potential for the handle wafer is the electrical ground potential of the attached electrical circuit, but other potentials may also achieve applicable results.

Advantageously, electrical contacts to the MEMS device (not shown) are formed on the front surface 18 of the device layer 13. In order to connect the handle wafer to an optimum potential, an electrical contact may be formed on the back surface 17 of the handle wafer 11. However, in an electronic assembly it is un-economical to have contacting members on both sides of the wafer structure. Since all other electrical contacts to the MEMS device are formed on the front surface 18 of the device layer 13, the contact to the handle wafer should preferably also be available on this surface.

Figure 2:
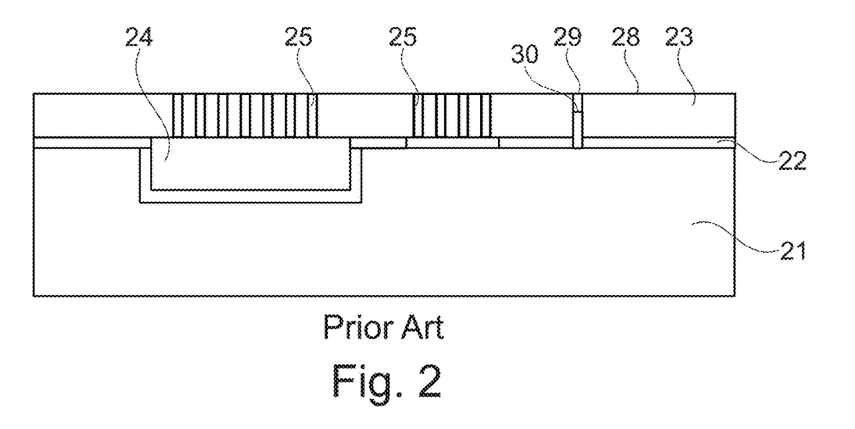
FIG. 2 illustrates a conventional method for bringing the electrical contact from the handle wafer to the front surface of the device layer.

A conventional method for bringing the electrical contact from the handle wafer to the front surface of the device layer is illustrated in FIG. 2. FIG. 2 illustrates a cavity-SOI wafer that comprises a handle wafer 21 with a cavity 24, a buried oxide layer 22, and a device layer 23. MEMS structures are manufactured on the cavity-SOI wafer by etching structure trenches 25 through the device layer 23. In addition to structure trenches 25 a further via trench 29 is etched through the device layer and the BOX layer 22, and at least partially filled with conductive material to form a plug 30. The material and manufacturing process of the conductive plug 30 and the doping levels of the handle wafer 21 and of the device layer 23 may be chosen so that the plug 30 makes an ohmic contact both to the handle wafer 21 and to the device layer 23 and thereby forms an electrically conductive path between the handle wafer 21 and the device layer 23. An electrical contact can then be made from the front surface 28 of the device layer 23 to the handle wafer 21 via this conductive path.

A known way to manufacture the plug is to first etch the via trench 29 and then to deposit a layer of conductive material on the front surface 28 of the device layer 23 so that it at least partially fills the via trench 29 covering the bottom surface and potentially the side walls of the via trench 29. Known methods for deposition include physical and chemical vapor deposition (PVD and CVD), vacuum evaporation (VE) and electrodeposition (ED). When using PVD, CVD and VE the sidewalls of the trench are also covered at least to some extent and finally the whole trench may be filled. By means of ED it is possible to create a plug that grows from the bottom surface of the trench only. After the deposition step, the material deposited by PVD, CVD or VE is patterned by photolithographic means and removed from all other areas but not from the via trench 29, or alternatively not from the via trench 29 and the vicinity of it. The material deposited by ED may not require patterning, but all surfaces in the same potential with the bottom surface of the trench become deposited in the ED process.

The disadvantage of these state of the art methods is thus that the via trench 29 must be etched in a separate etching step from structure trenches 25, and that an extra patterning and a further removal step for the conductive material may be required. Separate etching step is required because the structure trenches 25 must not be open during the deposition of the conductive material. The conductive material would otherwise fill also trenches 25, and it would be practically impossible to later remove the conductive material from the structure trenches.

An alternative method is to ink-jet conductive material into the trench such that a plug is formed. Ink-jetting is a technology where liquid substance is transferred as very small droplets from a nozzle to the target of deposition. The material to be deposited is in form of an ink, which comprises a liquid carrier medium and solid nanoparticles, the size of which is typically in the range of tens of nanometers. The liquid will evaporate away during and after the deposition depending e.g. on the temperature of the target and on subsequent heat treatments. Finally the deposited material is heat treated at a temperature such that the solid particles at least partially melt to connect to each other. The melting temperature of these nanoparticles is well below the melting temperature of corresponding bulk material.

In this method, no additional trench etching and patterning steps are required, because ink-jetting is a localized process that can be limited only to fill the desired via trenches 29 and leave the surrounding surface 28 and the structure trenches 25 unaffected. Furthermore, the structure trenches 25 and the via trench 29 can be manufactured during the same etching stage. A disadvantage is, however, that the ink-jetting process is slow for depositing a large amount of solid material as required by filling a trench. There is a need to reduce the additional time required by the stage of ink-jetting the plug with the nanoscale particles.

SUMMARY

The object of the present invention is to provide an optimized method of interconnecting layers separated by an insulating layer. This and other objects of the present invention are achieved with a microelectromechanical device and a method for manufacturing a microelectromechanical device according to the independent claims.

Embodiments of the invention include a microelectromechanical device that includes a layered solid structure. The solid structure comprises a first layer of electrically conductive material, a second layer of electrically conductive material, and a third layer of electrically insulating material between the first layer of electrically conductive material and the second layer of electrically conductive material. A via trench extends from a surface of the second layer of electrically conductive material through the third layer of electrically insulating material into the first layer of electrically conductive material, a surface on the first layer of electrically conductive material forming a bottom surface of the via trench. A conductive interconnection element extends on the bottom surface of the via trench, and from the bottom surface of the via trench to a height that is less than the height of the via trench, and in which height an electrically conductive path between the first layer of electrically conductive material and the second layer of electrically conductive material is created. The conductive interconnection element is substantially higher at a side wall of the via trench, or within an undercut formed into the third layer of electrically insulating material, than at a point between the side wall and a side wall opposite to it.

Embodiments of the invention include also method for manufacturing a microelectromechanical device with a layered solid structure. The solid structure comprises a first layer of electrically conductive material, a second layer of electrically conductive material, and a third layer of electrically insulating material between the first layer of electrically conductive material and the second layer of electrically conductive material. The method includes fabricating a via trench that extends from a surface of the second layer of electrically conductive material through the third layer of electrically insulating material into the first layer of electrically conductive material, a surface on the first layer of electrically conductive material forming a bottom surface of the via trench. The method also includes forming an ink-jetting set-up for a mixture of liquid carrier and nanoparticles of conductive material. For the specific ink-jetting setup a process period is determined. During said process period, capillary flow of nanoparticles to peripheral edges of an ink-jetted blob of said mixture is induced. Droplets of the mixture are ink-jetted within said period into a blob on the bottom surface of the via trench, and the layered solid structure is heat treated to evaporate the liquid carrier of the mixture Further advantages of the invention are discussed in more detail with the following embodiments.

BRIEF DESCRIPTION OF THE DRAWINGS

In the following the invention will be described in greater detail, in connection with preferred embodiments, with reference to the attached drawings, in which.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various implementations of microelectromechanical devices that are generally known to a person skilled in the art may not be specifically described herein.

Figure 3:
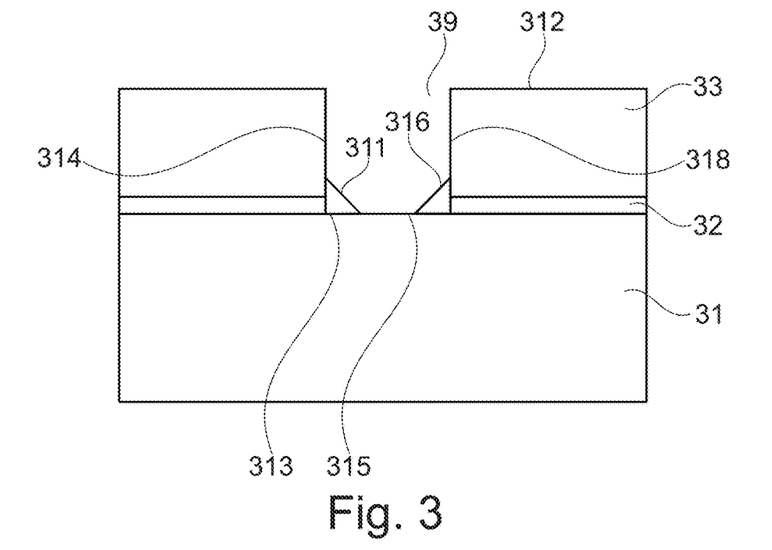
FIG. 3 illustrates a microelectromechanical device structure that includes a layered solid structure formed of at least three different material layers.

The schematic of FIG. 3 illustrates a microelectromechanical device structure that includes a layered solid structure formed of at least three different material layers. In the exemplary embodiment, a SOI wafer comprising a handle wafer layer, a buried oxide layer, and a device layer is shown. The handle wafer illustrates here a first layer of electrically conductive material 31 (hereinafter: the first layer). The first layer 31 provides a support layer, advantageously mainly formed of doped silicon, the resistivity of which varies according to the applied doping level. The term mainly in this context means that the bulk (at least half) of the layer is of the particular material, while the layer may also include void regions and/or structured regions of some other material.

The device layer illustrates here a second layer of electrically conductive material 33 (hereinafter: the second layer). The second layer 33 provides an active layer, advantageously mainly formed of doped silicon with a thickness between 1 and 100 microns. The first layer 31 is typically thicker than the second layer 33, typically the thickness of the first layer is at least 300 μm but often 500-600 μm to allow handling of the wafer without risk of breakage and without too much bending due to gravity and handling forces.

The buried oxide layer illustrates here a third layer of insulating material 32 (hereinafter: the third layer). The third layer 32 thus provides an electrically insulating region between the electrically conducting regions. Advantageously the third layer is mainly formed of silicon dioxide. The thickness of the third layer 32 is typically between 0.1 and 10 microns. The third layer may be produced, for example, by oxygen ion beam implantation of a silicon wafer, or by wafer bonding an oxidized silicon wafer to another wafer.

The microelectromechanical device includes also a via trench 39 that begins from a surface 312 of the second layer 33, extends through the second layer 33 and through the third layer 32 into the first layer 31. The surface 312 of the second layer 33 is provided by the outer surface that faces away from the third layer 32, and is on the side of applicable electrical contacts of the microelectromechanical device. In the bottom of the via trench 39, there is at least one conductive interconnection element 311 that extends on the bottom surface 315 of the via trench, and from the bottom surface 315 of the via trench to a height in which an electrically conductive path between the first layer 31 of electrically conductive material and the second layer 33 of electrically conductive material is created. Contrary to the prior art plug fillings, the conductive interconnection element does not cover the entire sidewall of the trench but is substantially higher at a side wall 314 of the via trench, or within an undercut formed into the third layer of electrically insulating material, than at a point between the side wall 314 and a side wall 318 opposite to it.

FIG. 3 illustrates a structure without an undercut. In such structure, the conductive interconnection element 311 is in contact with the side wall 314 of the via trench, and therefore the height of the conductive interconnection element 311 at the side wall is the same as, or exceeds the thickness of the third layer of electrically insulating material. An ohmic contact is thus formed between the second layer 33 and the first layer 31 through the conductive interconnection element 311. The conductive interconnection element 311 is also substantially higher at a side wall 314 of the via trench 39 than in at a point between the side wall 314 and a side wall 318 opposite to it. The conductive interconnection element 314 thus acts as a fillet that levels off the interior angle between the side walls and the bottom of the via trench. For example, the conductive interconnection element 311 levels off the interior angle between peripheral bottom corner 313 between the side wall 314 and the bottom surface 315, and at the same time extends along the side wall 314 from the bottom of the via trench to create the ohmic contact between the first and the second layers.

The cross-section of FIG. 3 illustrates an exemplary solution in which the height of the conductive interconnection element 311 decreases as a function of distance from the side wall 314 it is in abutment with. In such a case the interconnection element 311 is substantially higher at the side wall 314 than at any point between the side wall 314 and a side wall 318 opposite to it. It is noted, however, that the via trench may have various forms and include more inner corners incorporating more than one conductive interconnection elements. Furthermore, as will be described later on, the interconnection element may take various forms within the distance between the opposite side walls. At some point between a side wall and a side wall opposite to it, however, the interconnection element is lower than at the side wall.

The exemplary solution of FIG. 3 includes two conductive interconnection elements 311, 316 in both peripheral bottom corners of a linear via trench. It is noted, however, that the first and the second layers can, at minimum, be electrically connected through only one conductive interconnection element. On the other hand, the via trench may have various forms and include more inner corners incorporating more than one conductive interconnection elements.

FIG. 3 illustrates further an exemplary configuration in which the two conductive interconnection elements 311, 316 extend along opposite side walls 314, 318, and are separated by a distance from each other. Accordingly, the height of each of the conductive interconnection elements 311, 316 at a point between the side walls 314, 318 is zero. In this example, the interconnection elements 311, 316 are of the same height so that the zero height is reached in and around the middle between the side walls 314, 318. However, as will be shown later, conductive interconnection elements extending from different side walls of the via trench may alternatively form one or more unified interconnection element regions that partially or fully cover the bottom of the via trench. The height of such unified interconnection element regions may also vary between the opposite side walls. For example, in the via trench of FIG. 3, the fillet shape of the conductive interconnection elements 311 could be flatter such that a concave conductive corner volume covering also the bottom surface of the via trench is formed. However, the height of such formed unified interconnection element region is lowest at some point between the opposite side walls.

The configuration of FIG. 3 is advantageous because the conductive interconnection element extends in its full height at the most efficient location for formation of an electrical contact between the first layer 31 and the second layer 33, but in lesser amount in other parts of the via trench. Only a minimum amount of material is therefore needed for the desired electrical contact, which means that also the time required for fabricating the electrical contact between the conductive layers is reduced.

Figure 4:
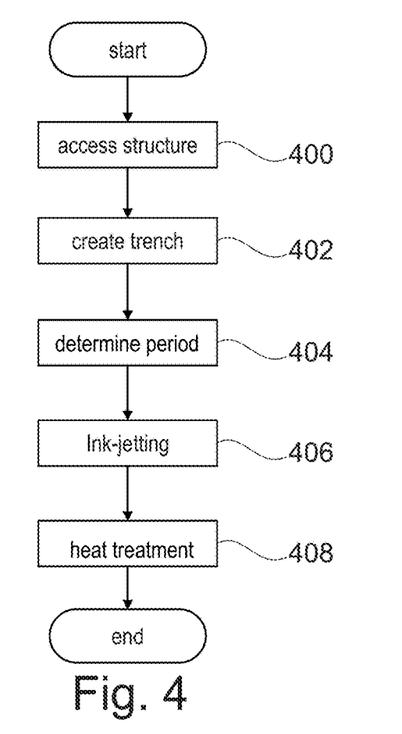
FIG. 4 illustrates stages of a novel method applicable for fabricating the claimed microelectromechanical device structures.

FIG. 4 illustrates stages of a novel method applicable for fabricating the claimed microelectromechanical device structures, for example ones shown in FIG. 3. The method begins by accessing (400) a layered solid structure that comprises a first layer 31 of electrically conductive material, a second layer 33 of electrically conductive material, and a third layer 32 of electrically insulating material. The insulating third layer 32 is between the first layer 31 and the second layer of electrically conductive material, as shown in FIG. 3. The layers may be formed by depositing layers of different material on top of each other, or pre-configured wafer structures with one or more readily combined layers may be used together to form the layered structure.

In the method, a via trench extending from a surface 312 of the second layer 33 through the second layer of electrically insulating material into the first layer of electrically conductive material is fabricated (stage 402). The fabrication of the via trench may include etch mask deposition, photolithography, etching and other similar operations known to those skilled in the art of fabricating microdevices. In the fabrication, material is removed from the layered solid structure in such a manner that a region that is void of the conducting and insulating materials is formed into the layered solid structure. By referring to the structure of FIG. 3, the void region forms a steep-sided depression that extends within the solid structure such that a side wall 314 of the trench includes a section of insulating material of the third layer, and a section of conductive material of the second layer, and at least the bottom surface 315 of the trench provides access to the conducting material of the first layer. Advantageously, the bottom surface 315 of the trench aligns with the top surface of the first layer, or the bottom surface 315 of the trench is recessed into the first layer.

Advantageously, the side walls 314 of the via trench are, within tolerances, perpendicular to the surface 312 of the second layer 33, and the bottom surface 315 of the via trench is, within tolerances, parallel to the surface 312 of the second layer 33. The via trench may, however, include many linear or curvilinear forms within the scope. A bottom corner 313 of the via trench 39 is at the peripheral edge of the bottom surface 315 of the via trench.

In the exemplary case of FIG. 3 configuration, the layered solid structure is shown to be a SOI wafer, and the via trench 39 is shown to have a longitudinal linear form in the surface 312 of the second layer 33. The side walls 314 of the via trench is shown to be perpendicular to the surface 312 of the second layer 33, and the bottom 315 of the via trench is shown to be parallel to the surface 312 of the second layer 33, as shown in FIG. 3.

It has now been detected that the manufacturing of a layered structure that enables positioning contacts on one side of the layered structure can be performed quicker and with less materials, still without compromising the good quality of connection between the first and second layers. For the improvement, a process period for a specific ink-jetting setup is determined (stage 404). This period corresponds to a time during which capillary flow of nanoparticles to peripheral edges of an ink-jetted blob of said mixture is, and remains induced.

The specific ink-jetting setup refers here to a set of parameters that are fixed to remain constant during ink-jetting treatment of the at least one via trench. The parameters are adjusted to enable formation of a liquid blob that is in contact with at least one bottom corner of the via trench. The solid material nanoparticles of the droplet mixture are advantageously selected from a group of conductive materials that are known to be well compatible with the silicon material in the layers of the solid layered structure. These materials include, for example, silver, gold, aluminum and doped silicon, but many other conductive materials may be used within the scope. Other process parameters that may be adjusted to induce the desired capillary flow within an ink-jetted blob include, for example, the size of the droplets, the direction of the jet, the kinetic energy of the droplets, the amount of nanoparticles in the droplet mixture, viscosity of the droplet mixture, wetting angle of the target surface, the temperature of the target surface, evaporation rate of the liquid carrier, to name a few. A person skilled in that art of ink-jetting, and provided with the knowledge of these required characteristics of the blob is able to arrive to one or more optimal parameter combinations that result in the desired capillary coffee stain effect flow that transfers the nanoparticles to peripheral edges of the ink-jetted blob.

The defined process period is adjusted to dimension the size of the ink-jetted blob such that the nanoparticles accumulated from the ink-jetted substance to the peripheral edges form a peripheral element, which enables an ohmic connection between the first layer and the second layer. As shown in FIG. 3, the conductive interconnection element 311 thus has to extend from the bottom corner 313 of the via trench 39 along the side wall 314 of the via trench 39 towards the surface 312 of the second layer 33 of electrically conductive material, and at least to a height of the third layer 32 of electrically insulating material.

Now, when an amount of droplet mixture is ink-jetted (stage 406) onto the bottom of the via trench, and the process period has not been exceeded, capillary flow of nanoparticles to peripheral edges of an ink-jetted blob of said mixture is induced. In the capillary effect, liquid evaporating from the edge of the blob is replenished by liquid of the interior. For this, the solid nanoparticles within the mixture begin to move towards the bottom corner of the via trench and collect into an uneven formation against the peripheral wall of the via trench. The ink-jetting can take place for the whole process period, or it may be shorter than the process period, as long as the formation of the ohmic contact between the first and the third layer by the accumulated nanoparticles is enabled.

After the ink-jetting, the layered solid structure may be heat treated (stage 408) into a melting temperature of the nanoparticles, such that the uneven formation of nanoparticles connects into a solid conductive interconnection element. Advantageously the heat treatment is performed after all liquid in the blob has evaporated. As shown in FIG. 3, the conductive interconnection element 311 is thus substantially higher at a side wall 314 of the via trench 39 than at a point between the side wall 314 and a side wall 318 opposite to it. In this example, the conductive interconnection element 311 is actually substantially higher at a side wall 314 of the via trench 39 than at any point between the side wall 314 and a side wall 318 opposite to it, and is at minimum in the middle between the side wall 314 and the side wall 318 opposite to it. It is noted that the top surface of a conventionally filled via plug may dry into a slightly concave form. The minimal difference between the height of the plug at the side wall and in the middle of the plug does is not a substantial difference.

For a substantial difference, the height of the conductive interconnection element at a side wall of the via trench, or within an undercut formed into the third layer of electrically insulating material is at least two times the height of the conductive interconnection element at said point. The substantial difference thus refers to a difference achievable by use of the capillary flow of nanoparticles to peripheral edges of a blob.

The term undercut relates here to a portion of the third layer that has become void before the ink-jetting stage. Typically such undercut is formed in the manufacturing stage of the via trench, for example as a result of etching through the layers. The undercut therefore creates into the third layer a void region that before the ink-jetting stage circumscribes void region of the via trench. Accordingly, a cross section of the void region by the via trench and the undercut is larger than a cross section of the void in other parts of the via trench, when the cross section is parallel to the layers. An undercut space is thus formed between the first and second layers of electrically conductive material.

Figure 5:
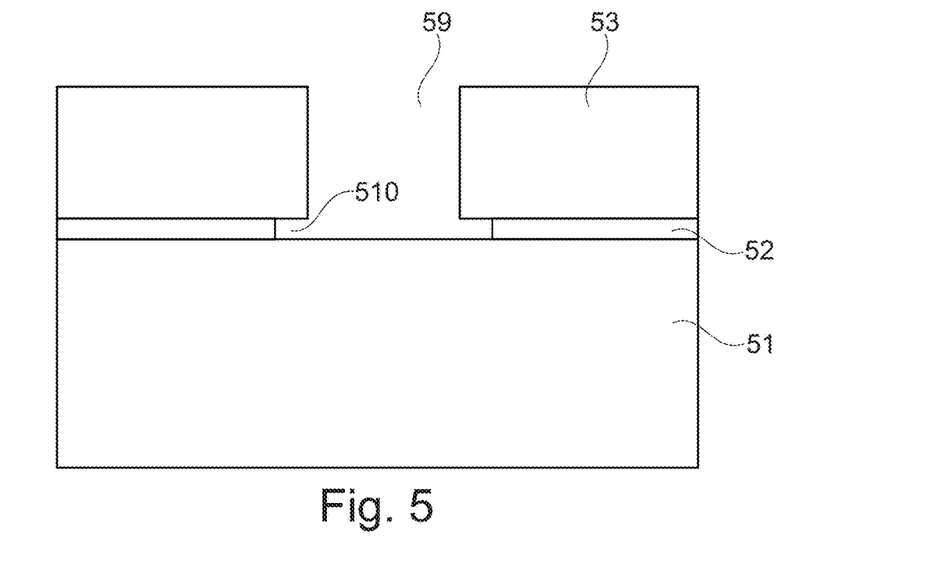
FIG. 5 illustrates schematically an alternative form of a layered solid structure.

In the configuration of FIG. 3, the side wall 314 has a uniform linear profile from the surface 312 of the second layer 33 to the bottom 315 of the via trench 39. FIG. 5 illustrates schematically (not in scale) another possible form of the layered solid structure after the fabrication stage 402. As in FIG. 3, the layered solid structure comprises a first layer 51 of electrically conductive material, a second layer 53 of electrically conductive material, and a third layer 52 of electrically insulating material. When the via trench 59 is etched through the third layer 52, an undercut 510 may be formed into the buried oxide layer 52.

Figure 6:
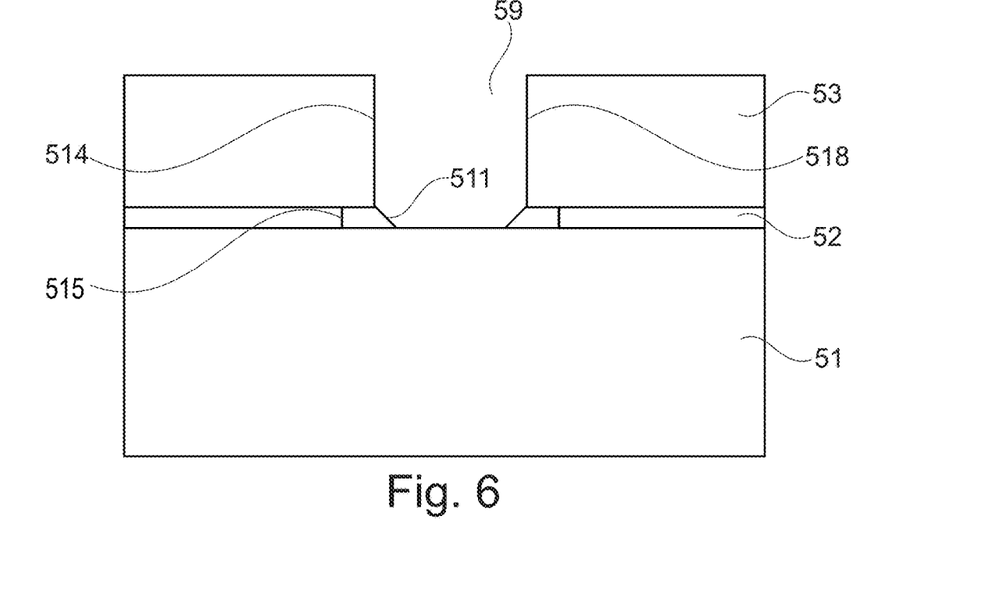
FIG. 6 illustrates a possible form for two conductive interconnection elements.

FIG. 6 illustrates a possible form for the conductive interconnection elements 511 resulting from use of the method of FIG. 4 in the structure of FIG. 5. The droplets that include nanoparticles of conductive material may be ink-jetted to the bottom of the via trench 59. The droplets form one or more corner blob that, due to the capillary action, flow into the undercuts. The solid nanoparticles within the blobs start to collect towards the bottom peripheries of the blobs where they remain even after the liquid has been evaporated from the blob. For example, in FIG. 6, the deposited conductive material is shown to accumulate into a fillet shaped interconnection element 511 that begins at the peripheral bottom corner 513 of the undercut 510, fills the undercut 510 at the side wall, and begins to decrease in height after the side wall 514. After a heat treatment, a solid conductive corner structure 511 that electrically connects the first layer and the second layer is formed. The interconnection element 511 is substantially higher at a side wall 514 than at a point, practically at any point between the side wall 514 and a side wall 518 opposite to it.

Figure 7:
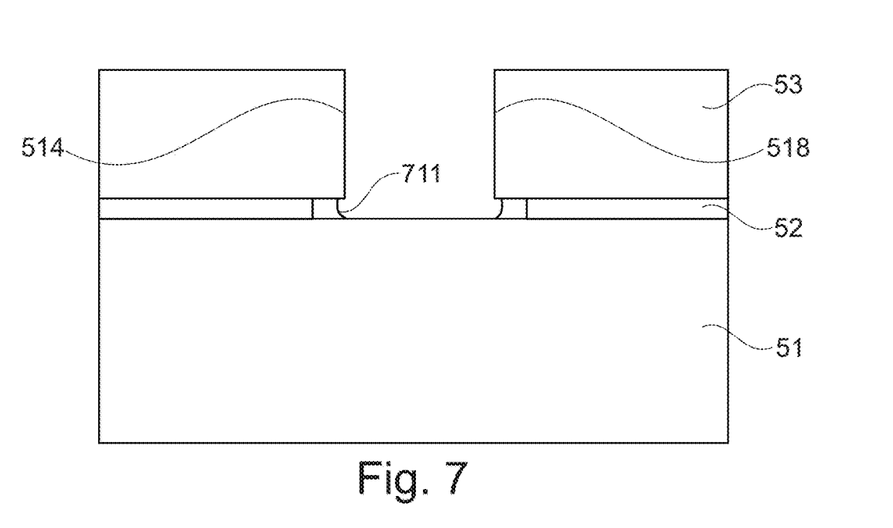
FIG. 7 illustrates a further possible form for a conductive interconnection element.
Figure 8:
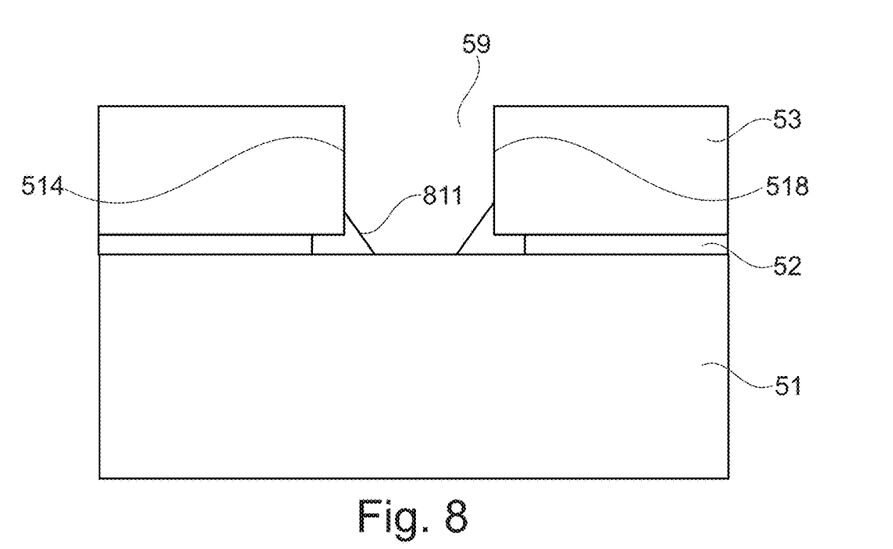
FIG. 8 illustrates a further possible form for the conductive interconnection element.
Figure 9A:
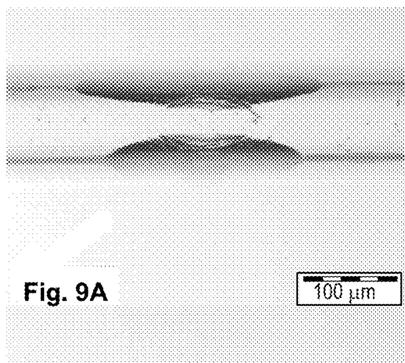
FIGS. 9a to 9d show results from a practical experiment.
Figure 9B:
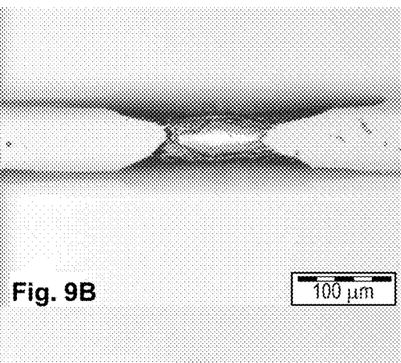
Figure 9C:
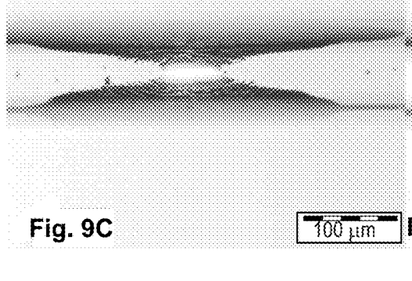
Figure 9D:
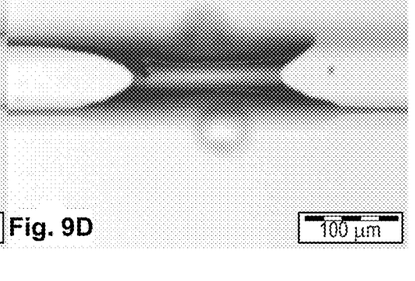
Figure 10A:
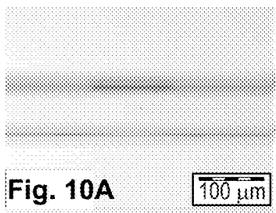
FIGS. 10a to 10f show results from another practical experiment.
Figure 10B:
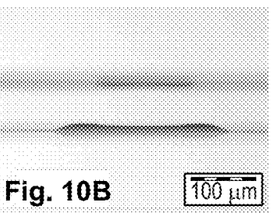
Figure 10C:
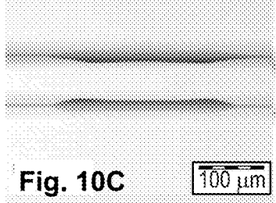
Figure 10D:
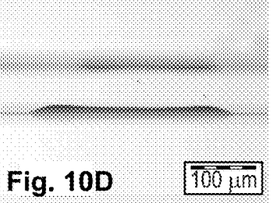
Figure 10E:
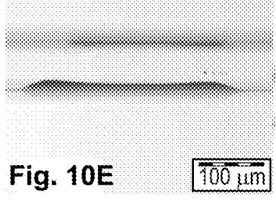
Figure 10F:
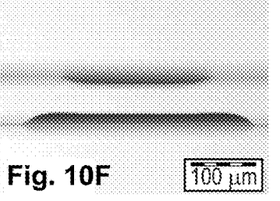

FIG. 7 illustrates a further possible form for the conductive interconnection element 711 resulting from use of the method of FIG. 4 in the structure of FIG. 5. FIG. 7 shows a conductive interconnection element 711 that only partially fills the undercut 510. The interconnection element 711 extends on the bottom surface of the via trench, and from the bottom surface of the via trench to a height in which an electrically conductive path between the first layer of electrically conductive material and the second layer of electrically conductive material is created. The interconnection element 711 is substantially higher within the undercut 510 than at a point between the side wall 514 and a side wall 518 opposite to it. As may be seen from FIG. 7, the interconnection element 711 is substantially higher within the undercut 510 than practically at any point between the side wall 514 and a side wall 518 opposite to it FIG. 8 illustrates a further possible form for the conductive interconnection element 811 resulting from use of the method of FIG. 4 in the structure of FIG. 5. FIG. 8 shows a conductive interconnection element 811 that fills the undercut, and extends to a height along the side wall 514. After the side wall 514, the height of the conductive corner structure 811, when taken from the bottom of the via trench 59, begins to decrease as a function of distance from the side wall 514. The interconnection element 811 is again substantially higher at a side wall 514 than at a point, practically at any point between the side wall 514 and a side wall 518 opposite to it.

Images in FIGS. 9a to 9d show a practical example from an experiment where different amounts of a mixture including liquid carrier and silver nanoparticles (Ag-ink) were deposited by ink-jetting into a 90 um wide via trench, on the bottom of the trench. The trench had an oblong form such that the trench was significantly longer than wide. The deposits formed two lines parallel to the side walls of the length dimension of the trench and each line was located close to the corresponding side wall. FIGS. 9a to 9d show a top view to the oblong via trench, and the images show the ink-jetted deposits immediately after deposition. Different amounts of ink show as different thicknesses of the lines. In each of the cases, the deposits are located at the peripheral bottom corner of the trench and leave the middle of the bottom of the trench without a deposit or with substantially smaller height of the deposit than the height close to the side walls of the trench. This is possible, if the amount of ink is chosen properly.

Images in FIGS. 10a to 10f show a practical example from an experiment where different amounts of a mixture including liquid carrier and gold nanoparticles (Au-ink) were deposited into a 90 um wide via trench that again had an oblong form that was much longer than the width. The deposits formed two lines parallel to the side walls of the length dimension of the trench, and each line was located close to the corresponding side wall. FIGS. 10a to 10f show a top view to the via trench, and the images show the ink-jetted deposits immediately after deposition. Different amounts of ink show as different thicknesses of the lines. The deposits are located at the peripheral bottom corners of the trenches and leave the middle of the bottom of the trench without a deposit, if the amount of ink is chosen properly.

The deposition experiments depicted in FIGS. 9a through 9d and 10a through 10f prove that it is possible to produce a conductive interconnection element to a desired location, and in a desired form by selecting a suitable geometry, location and amount for the deposit.

Figure 11:
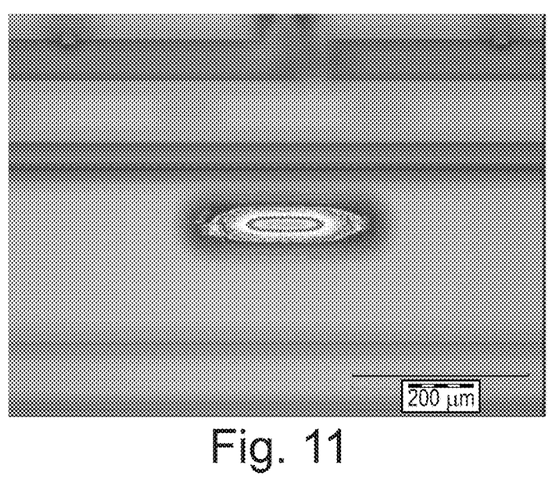
FIG. 11 shows results of an experiment where liquid substance was deposited in a deep oblong trench.

The image in FIG. 11 shows results of an experiment where Ag-ink was deposited in a 60 μm wide, 220 μm long and 50 μm deep oblong trench. Figure shows the deposit after evaporation of the liquid carrier. The amount of ink was adjusted to be high enough so that the deposits along the side walls in the length dimension merged together, and after deposition covered the entire bottom surface of the trench. However, during evaporation of the liquid carrier the silver material was drawn from the center of the trench to the peripheral edges producing the desired shape and location of the conductive interconnection element. The right shape and location was controlled by selecting the concentration of the nanoparticles and the volume of the deposit. The process producing the result of FIG. 11 is explained in more detail in FIGS. 12a to 12b.

Figure 12A:
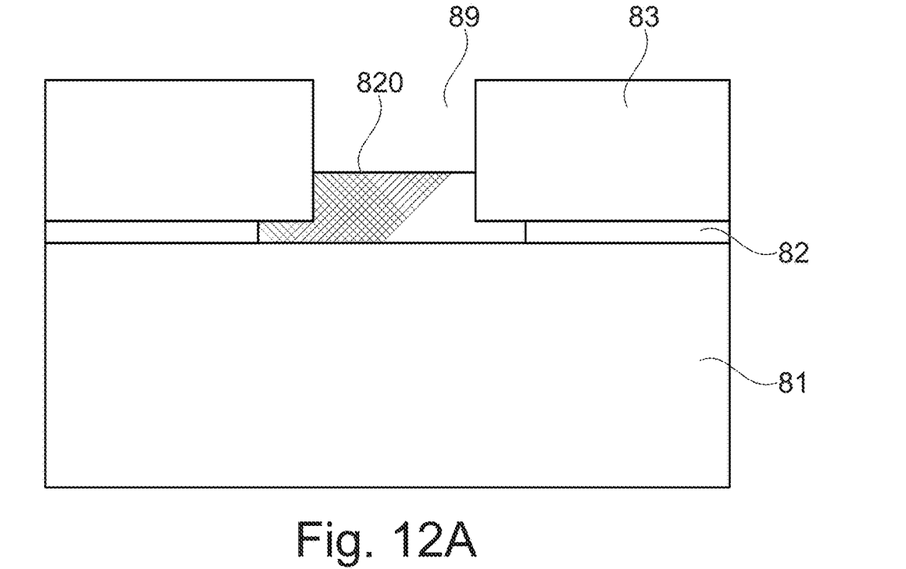
FIGS. 12a to 12b illustrate further the process producing the result of FIG. 11.
Figure 12B:
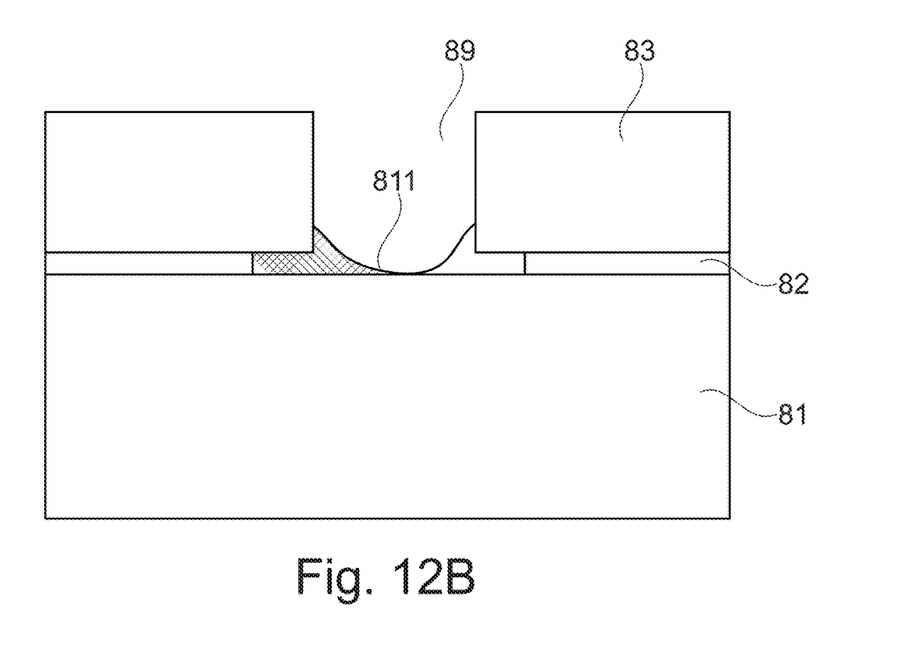

In FIGS. 12a and 12b, as in FIG. 3, the a layered solid structure comprises a first layer 81 of electrically conductive material, a second layer 83 of electrically conductive material, and a third layer 82 of electrically insulating material. When the via trench 89 is etched through the third layer 82, an undercut of the buried oxide layer has been formed. As shown in FIG. 12A, a thin layer of silver including ink mixture may be first deposited on the bottom of the via trench. In this example, the mixture forms a blob 820 that initially covers uniformly the whole bottom of the via trench. During evaporation of the liquid carrier material the nanoparticles within the blob start to withdraw from the center of the via trench towards the peripheral bottom corners of the trench due to capillary effect. At the same time the solid silver particles within the blob start to collect near the bottom edges of the blob, where they finally remain in an uneven formation in the undercut and against the side wall, after all the liquid has been evaporated. After an annealing step, a conductive interconnection element 811, also visible in the image of FIG. 11, is formed.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A microelectromechanical device including a layered solid structure, the solid structure comprising:
    a first layer of electrically conductive material;
    a second layer of electrically conductive material;
    a third layer of electrically insulating material between the first layer of electrically conductive material and the second layer of electrically conductive material;
    a via trench extending from a surface of the second layer of electrically conductive material through the third layer of electrically insulating material into the first layer of electrically conductive material, a surface on the first layer of electrically conductive material forming a bottom surface of the via trench;
    a conductive interconnection element extending on the bottom surface of the via trench, and from the bottom surface of the via trench to a height that is less than the height of the via trench, and in which height an electrically conductive path between the first layer of electrically conductive material and the second layer of electrically conductive material is created;
    the conductive interconnection element is substantially higher at a side wall of the via trench, or within an undercut formed into the third layer of electrically insulating material, than at a point between the side wall and a side wall opposite to it.

2. The microelectromechanical device of claim 1, wherein the conductive interconnection element is formed of nanoparticles solidified into the conductive interconnection element;
    the difference in height of the conductive interconnection element at a side wall of the via trench, or within an undercut formed into the third layer of electrically insulating material and the height of the conductive interconnection element at said point results from controlled use of capillary flow of nanoparticles in a liquid substance towards peripheral edges of the trench before said nanoparticles are solidified into the conductive interconnection element.

3. The microelectromechanical device of claim 1, wherein the height of the conductive interconnection element at a side wall of the via trench, or within an undercut formed into the third layer of electrically insulating material is at least two times the height of the conductive interconnection element at said point.

4. The microelectromechanical device of claim 1, wherein the height of the conductive interconnection element at a side wall of the via trench is less than three quarters of the height of the via trench.

5. The microelectromechanical device of claim 1, wherein said point of the conductive interconnection element between the side wall and a side wall opposite to it is in the middle between the side wall and the side wall opposite to it.

6. The microelectromechanical device of claim 1, wherein conductive interconnection element is higher at the side wall of the via trench, or within an undercut formed into the third layer of electrically insulating material, than at any point between the side wall and a side wall opposite to it.

7. The microelectromechanical device of claim 1, wherein the height of the conductive interconnection element decreases in relation to the distance from the side wall.

8. The microelectromechanical device of claim 1, wherein the conductive interconnection element at least partly fills the undercut between the first layer of electrically conductive material and the second layer of electrically conductive material.

9. The microelectromechanical device of claim 8, wherein the conductive interconnection element has a form of a concave fillet.

10. The microelectromechanical device of claim 1, wherein the via trench has an oblong form wherein the length dimension of the bottom surface of the via trench is at least three times the width dimension of the bottom surface of the via trench.

* * * * *